United States Patent [19]
Chong et al.

[11] Patent Number: 5,493,075
[45] Date of Patent: Feb. 20, 1996

[54] FINE PITCH SOLDER FORMATION ON PRINTED CIRCUIT BOARD PROCESS AND PRODUCT

[75] Inventors: Ku H. Chong; Charles H. Crockett, Jr.; Julian P. Partridge; Bhavyen S. Sanghavi, all of Austin, Tex.

[73] Assignee: International Business Machines Corporation, Armonk, N.Y.

[21] Appl. No.: 315,746

[22] Filed: Sep. 30, 1994

[51] Int. Cl.$^6$ ............................................. H05K 1/18
[52] U.S. Cl. ..................... 174/261; 174/260; 174/250; 361/760; 361/767; 228/180.22
[58] Field of Search ................................ 174/250, 259, 174/260, 261; 228/179.1, 180.21, 180.22; 361/760, 765, 767

[56] References Cited

U.S. PATENT DOCUMENTS

| | | |
|---|---|---|
| 4,722,470 | 2/1988 | Johary . |
| 5,060,844 | 10/1991 | Behun et al. . |
| 5,147,084 | 9/1992 | Behun et al. . |

OTHER PUBLICATIONS

IBM TDB, vol. 37, No. 02B, Feb. 1994, "Improvements in the Sacrificial Substrate Burn–In Methodology for Known Good Die", pp. 19–20.
IBM TDB, vol. 30, No. 7, Dec. 1987, "Fine Pitch Printing for Surface Mounted Technology", pp. 314–315.
Research Disclosure, Nov. 1988, No. 295, "Solder Mask Elimination on Printed Circuit Boards".
Research Disclosure, Feb. 1992, No. 334, "Ladder Pattern for Soldering Circuit Board Ground Pads".
*Sandia National Laboratories*, DE93 009631, "A Maskless Flip–Chip Solder Bumping Technique", Chu et al.
*Circuits Assembly*, Feb. 1993, "A Step in the Right Direction", Payne et al, pp. 59–64.

*Primary Examiner*—Laura Thomas
*Attorney, Agent, or Firm*—Casimer K. Salys

[57] ABSTRACT

A method, and product created thereby, by which low melting point solder suitable for reflow connection of components is formed on select fine pitch contacts of a printed circuit board. The method is particularly suited to the attachment of flip-chip die to printed circuit boards which also include coarse pitch surface mount components. Controlled volumes of solder are formed onto fine pitch contacts of the printed circuit board through selective holes in a mask formed onto the board. The deposit is accomplished by molten solder immersion preferably using conventional hot air solder level manufacturing equipment. The volume of solder is related to the thickness of the mask. The mask is then removed, the deposited low temperature solder is flattened, and the coarse pitch contacts are covered with solder paste in a conventional screening process. Flux is applied to the fine pitch contacts. After component placement, the solder reflow connects in one operation both the fine and coarse pitch components to their respective printed circuit board contacts.

4 Claims, 5 Drawing Sheets

FINE PITCH SOLDER FORMATION ON PRINTED CIRCUIT BOARD PROCESS AND PRODUCT

CROSS-REFERENCE TO RELATED APPLICATIONS

The present application is related to co-pending patent application Ser. No. 08/298,983 filed Aug. 31, 1994 and assigned to the assignee of the present application.

BACKGROUND OF THE INVENTION

The present invention is generally directed to printed circuit board processes and products. More particularly, the invention relates to the formation of fine pitch solder deposits in controlled volumes on printed circuit boards.

Surface mount technology is now routinely used to attach packaged integrated circuit devices to printed circuit boards. In one form, the practice involves the use of solder paste selectively deposited onto copper contacts of the printed circuit board through a stencil patterned with openings corresponding to the board contact locations. The solder paste is screen deposited in patterns on the printed circuit boards using the stencil as a mask and a doctor blade to squeegee the solder paste through the holes in the stencil. When the stencil is removed, the solder paste remains on the printed circuit board contacts.

Since the solder paste is typically 50% flux by volume, with the other 50% being particles of solder, the paste is also used to hold the component terminals in place during the solder reflow step which follows. The eutectic low melting point solder (63% tin, 37% lead-63/37) normally used permits reflow and a concurrent bonding of the component terminals to the printed circuit board contacts at a temperature (below 250 deg. C.) compatible with the glass transition capabilities of flame retardant level 4 (FR4) printed circuit board materials.

The spacing of the leads for packaged integrated circuit components typically exhibit a pitch no finer than 16 mils. This capability is consistent with conventional surface mount technology (SMT) processes using screen deposited solder paste to hold and connect packaged integrated circuit devices to printed circuit boards.

An integrated circuit connection technology using finer, less than 16 mil, pitch has been developed and is being used with advanced computer systems. The technology is generally known as flip-chip attachment (FCA), direct chip attachment (DCA) or technically identified as controlled collapse chip connection (C4). Instead of attaching the integrated circuit die to a lead frame in a package, the flip-chip design involves the formation of an array of solder balls on the surface of the integrated circuit die itself. The solder balls are composed of high melting point solder (3% tin, 97% lead-3/97) at an approximate pitch of 10 mils. The flip-chip die were originally designed to be connected to a ceramic substrate, in contrast to a printed circuit board, employing a controlled collapse solder reflow process accomplished at approximately 350 deg. C. This reflow temperature is suitable for the silicon die and ceramic substrate, but not for a conventional printed circuit board.

The high connection count and density of the flip-chip devices make them particularly attractive for advanced printed circuit board products using numerous integrated circuit chips and having extended functionality. This candidacy is reinforced by the fact that the photolithographic processes used to form conductive contact patterns on modern printed circuit boards have the capability to create correspondingly fine pitch patterns. Unfortunately, attempts to screen solder paste in the fine pitch patterns characterizing the flip-chip ball grid array has proven unsuccessful, in that some of the solder paste lifts off with the stencil and thereby produces non-uniform deposits of paste on various of the printed circuit board contacts. The phenomenon is attributed to the stencil opening aspect ratio (diameter to thickness), solder paste viscosity and rheology, paste formulation, solder paste particle diameter, and stencil material properties. The diameters of the holes are driven by the fine pitch of the flip-chip ball grid array, while the thickness of the stencil is dictated by the need for a minimum volume of solder to connect the balls on the die to the copper contact of the printed circuit board. Experience indicates that approximately 20–80 cubic mils of solder are needed for a nominal 4 mil wide printed circuit board contact to attain reliable connection between the ball of the flip-chip die and the copper contact.

In the absence of an effective solder paste screening process for depositing solder onto fine pitch printed circuit board contacts, the users of flip-chip die on printed circuit boards have developed two techniques for depositing low melting point solder on fine pitch printed circuit board contacts. The first process uses masking and electroplating to deposit the solder. This process includes the formation of a photolithographically defined mask, an electroplate bath deposition of low melting point solder on printed circuit board contacts not covered by the mask, a removal of the mask, and a reflow of the electroplated solder for shaping and blending. The process involves complex plating operations and has an associated high cost.

The other approach developed to selectively form low melting point solder on the fine pitch contacts of printed circuit boards involves the injection of molten solder through a dispensing head with a mask corresponding to the copper contact pattern of the printed circuit board. Unfortunately, the molten solder dispensing head is very expensive, requires a distinct mask for each different flip-chip die footprint, and dispenses the solder to the contacts of only one die location at a time.

In the context of this known technology, there remains the need for a process, and a product formed thereby, which will deposit or form a low melting point solder in controlled volumes on fine pitch printed circuit board contact patterns within the framework of conventional printed circuit board manufacturing while providing adequate solder volumes on coarse pitch contacts to connect conventional SMT components.

SUMMARY OF THE INVENTION

According to the teaching of the present invention, as characterized in products manufactured thereby, a method of forming fine pitch solder deposits on circuit boards comprises the step of forming a first mask over the circuit board with openings to first select circuit board contacts, depositing solder onto the first select circuit board contacts in volumes consistent with the height of the first mask by molten solder immersion, positioning a stencil over the circuit board with openings to second select circuit board contacts, and screen depositing solder paste into openings of the stencil. Components, whether of the flip-chip die or the conventional surface mount package, are held in place during the final low temperature solder reflow step using flux over the fine pitch solder deposits and solder paste for the conventional coarse pitch contacts.

According to one practice of the invention, a printed circuit board having both fine and coarse pitch contact patterns is a coated with a non-wetting to solder, temperature stable, and photoresponsive material, and then photolithographically processed to provide a mask exposing only the fine pitch printed circuit board contacts. The thickness of the mask is selected to ensure that the solder deposit on the exposed fine pitch contacts is of a volume consistent with reliable connection for the balls of the flip-chip die. The masked printed circuit board is sent through a molten solder immersion process, preferably a hot air solder level machine, to deposit solder onto the exposed fine pitch contacts in a volume consistent with the height of the mask. The mask is then stripped from the board. Following a conventional flattening of the fine pitch pattern deposited solder, solder paste is screened onto the coarse pitch contacts of the printed circuit board using a conventional stencil and doctor blade. Flux is applied in a similar manner to the flattened solder over the fine pitch contacts. Placement of the components and the conventional solder reflow complete the operation, with the molten immersion deposited solder connecting the fine pitch printed circuit board contacts to the flip-chip die and the paste solder connecting the coarse pitch printed circuit board contacts to the conventional surface mount technology components.

The invention forms low melting point solder balls on fine pitch printed circuit board contacts which are particularly suited for attaching flip-chip or other fine pitch components. The low temperature solder formed on the circuit board contacts reflows to connect the high melting point flip-chip solder balls. The flip-chip solder balls remain virtually intact during reflow as a consequence of their higher melting temperature, thereby providing a standoff height between the circuit board contact and the silicon die. This spaced interface ensures reliable attachment in the presence of a significant difference in coefficient of thermal expansion between the printed circuit board and the silicon die.

The ability to control the volume of solder deposited on the fine pitch printed circuit board contacts by controlling the thickness of the mask used during molten solder immersion is particularly valuable in that the volume of solder needed for reliable connection varies with the environment the printed circuit board and die are to sustain. For low end applications, such as desk top computers and workstations, the volume of solder needed to ensure reliable contact between the flip-chip die and the printed circuit board may be significantly less than that for high end, military hardware, type applications. This distinction is particularly relevant where organic encapsulants are used to seal flip-chip die as connected on printed circuit boards.

These and other features of the invention will be more clearly understood and recognized upon considering the detailed description which follows.

DETAILED DESCRIPTION OF THE PREFERRED EMBODIMENT

The focus of the invention is on the deposit of low melting point solder in controlled volumes on fine pitch printed circuit board contacts while maximizing the use of existing manufacturing equipment and minimizing process steps and complexity.

Figure 1:
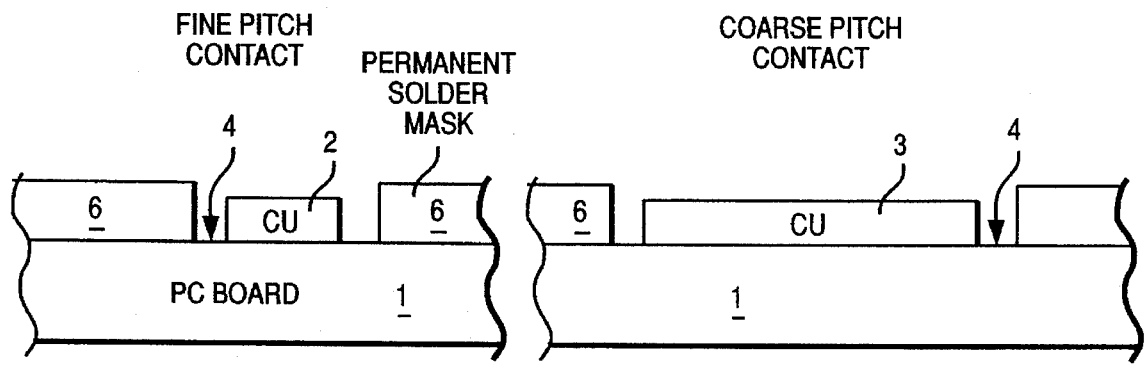
FIG. 1 depicts by schematic cross section fine and coarse pitch contacts on a printed circuit board.

A preferred practice of the invention begins with the printed circuit board structure depicted in FIG. 1. Printed circuit board 1 has a dielectric core and at least one surface composed of photolithographically defined copper patterns, including as shown in FIG. 1 a fine pitch contact 2 and coarse pitch contact 3 formed on surface 4 of board 1. The board also includes a permanent photolighographically defined solder mask 6, processed to expose select contact areas 2 and 3 of the copper trace on board 1 and the immediately adjacent areas of board surface 4. Fine pitch contact 2 is approximately 1.5 mils thick and approximately 4 mils in width or diameter. In contrast, coarse pitch contact 3 is approximately 1.5 mils thick and approximately 10 mils in width or diameter.

Figure 2:
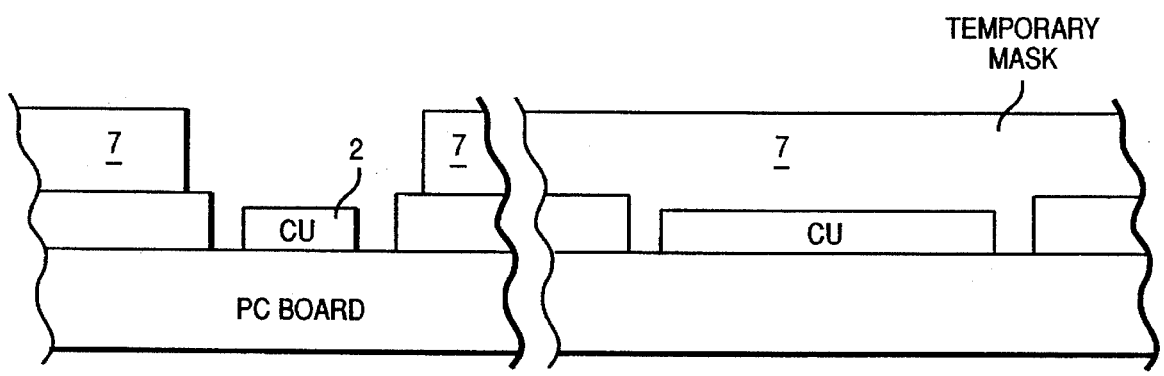
FIG. 2 depicts by schematic cross section the use of a temporary mask to selectively expose the fine pitch contacts of the printed circuit board.

FIG. 2 depicts the corresponding contact areas of the board following the formation of a temporary mask 7 over all but the area proximate fine pitch contact 2. Preferably, temporary mask 7 is composed of a photoimagable material, such as Enthone DSR 3241, which is curtain-coated, flood-screened or dry film applied onto the entire printed circuit board, and then imaged and developed away exposing the area around contact 2. Mask 7 may also be composed of other materials, such as the screenable UV setting polymers available from APT Lost River Product or Tek Spray Inc. These UV setting polymers are preferably screened onto the printed circuit board in all areas except the contacts, and then exposed to UV exposure to fix such mask pattern.

The key characteristics required of mask 7 be that it not be wettable by solder, that it be capable of withstanding the nominal 250 degree C temperature of the 63/37 solder immersion, that it be readily strippable, and that it be controllable in thickness. The thickness control is important in that the thickness of mask 7 defines to a large extent the volume of solder deposited onto contact 2 during the subsequent molten solder immersion operation. Recall that the volume of solder needed for reliable connection varies with the board application. Preliminary experience indicates that a 2 mil thick mask 7 will provide 40 cubic mils of solder for a 4 mil contact.

Figure 3:
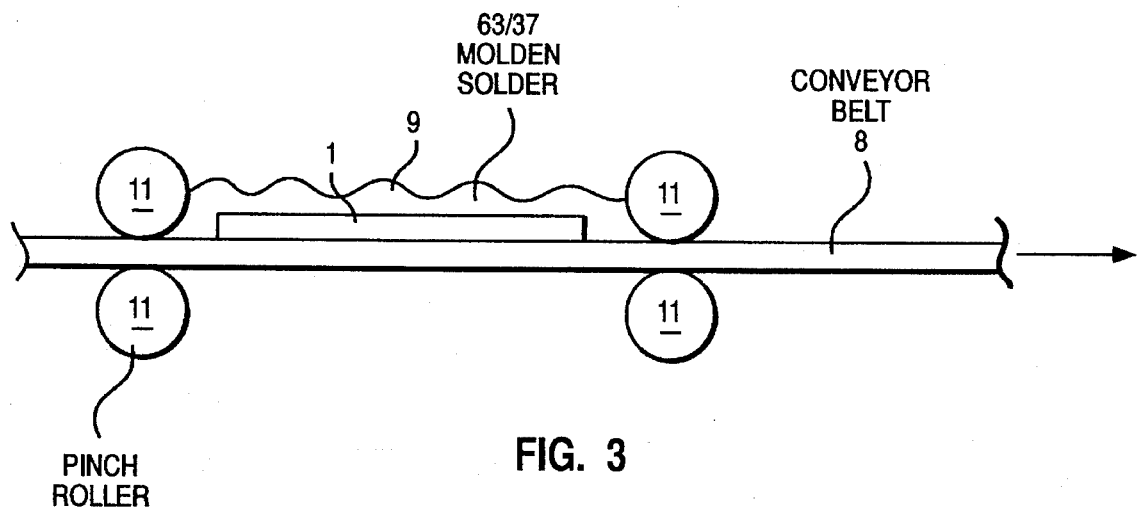
FIG. 3 schematically depicts the sending of the masked printed circuit board through a molten solder immersion in a hot air level machine.

FIG. 3 depicts the next step in the operation, namely, sending the masked printed circuit board of FIG. 2 through a molten solder immersion using a hot air solder level machine, or the like. Hot air solder level machines are well known devices used to prepare the surfaces of copper conductors on printed circuit boards for subsequent soldering by forming a thin layer of solder to prevent copper oxidation. As schematically depicted in FIG. 2, the printed circuit board 1 is placed on a conveyer belt 8 and moved through molten solder bath 9. The solder is retained in the bath through the action of pinch rollers 11. This step of the invention is readily accomplished in that it involves machinery and operations which already exist but have heretofore been used for a different purpose.

It should be recognized that equipment other than the hot air solder level machine can be used to form the specified volumes of solder on the fine pitch contacts. For example, the board and mask could be dipped in a molten solder bath or subjected to a wave solder operation.

Figure 4:
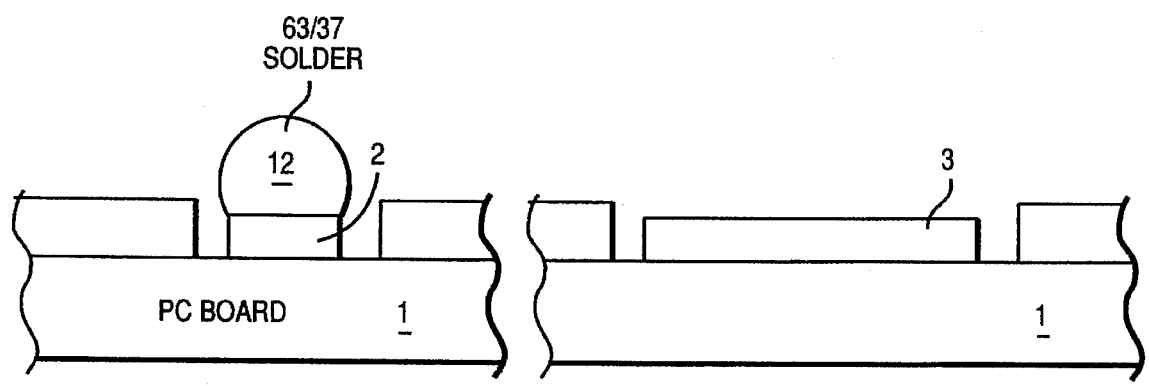
FIG. 4 depicts by schematic cross section the solder formed on the fine pitch contacts following the removal of the mask.

FIG. 4 depicts by schematic cross section the corresponding parts of printed circuit board 1 after the molten immersion is completed and temporary mask 7 is stripped. Note that fine pitch contact 2 is covered by solder ball 12 while coarse pitch contact 3 is exposed. This is important in two respects. First, coarse pitch contact 3 may hereafter be subject to processing in a manner consistent with prior practices. On the other hand, fine pitch contact 2 has formed thereon a relatively large volume of solder without the need for further conditioning. The volume of solder deposit 12 is related to the thickness of temporary mask 7. Namely, if the thickness of temporary mask 7 is greater, so too is the volume of the solder 12. Thereby, the earlier noted need for refinement of solder volume based upon the intended severity of the environment expected for the printed circuit board can be readily defined by controlling the thickness of the temporary mask 7.

According to the preferred practice of the invention, deposited solder ball 12 is next subjected to a flattening operation using a mechanical flattening tool, such as a press with a flat plate. The flat surface of the solder reduces the likelihood of lateral movement in the silicon die as a result of the balls of the silicon die interacting with the curved surface of solder 12 before reflow is completed.

Figure 5:
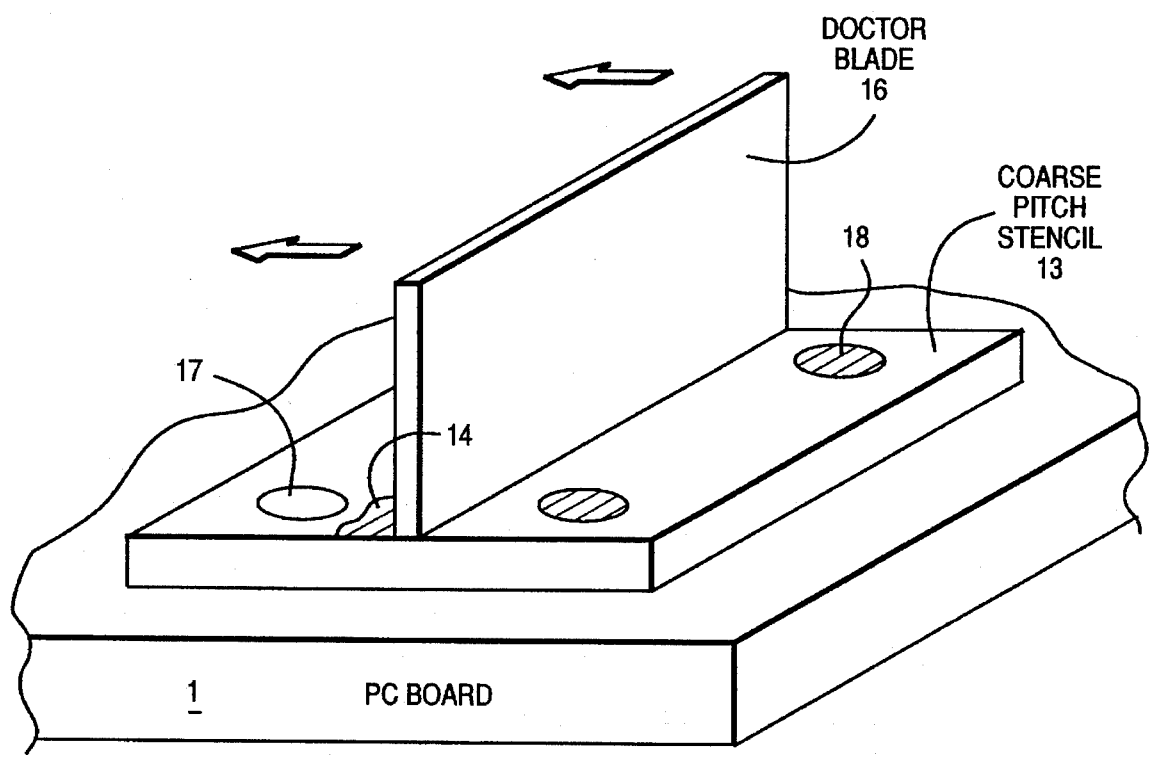
FIG. 5 depicts by perspective the screening of solder paste onto the coarse pitch contacts of the printed circuit board using a stencil and doctor blade.
Figure 6:
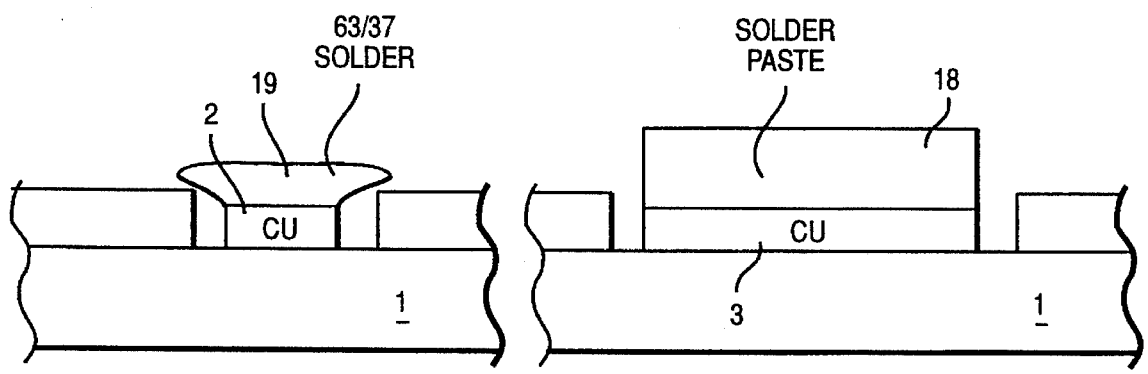
FIG. 6 depicts by schematic cross section the flattened fine pitch solder deposit and screen deposited coarse pitch contact solder paste.

FIG. 5 depicts by schematic perspective the next operation, whereby printed circuit board 1 is covered by coarse pitch stencil 13 and solder paste 14 is squeegeed by action of doctor blade 16 into coarse pitch contact aligned holes 17 to provide deposits of solder paste 18. As shown in the schematic cross section of FIG. 6, solder paste 18 remains over coarse pitch contact 3 when coarse pitch stencil 13 is removed. Solder paste 18 is typically deposited to a thickness of approximately 6–8 mils and is composed of approximately 50/50 percent by volume of flux and low melting point solder (63/37). FIG. 6 also depicts flattened solder ball 19 over fine pitch contact 2, likewise composed of low melting point solder.

Figure 7:
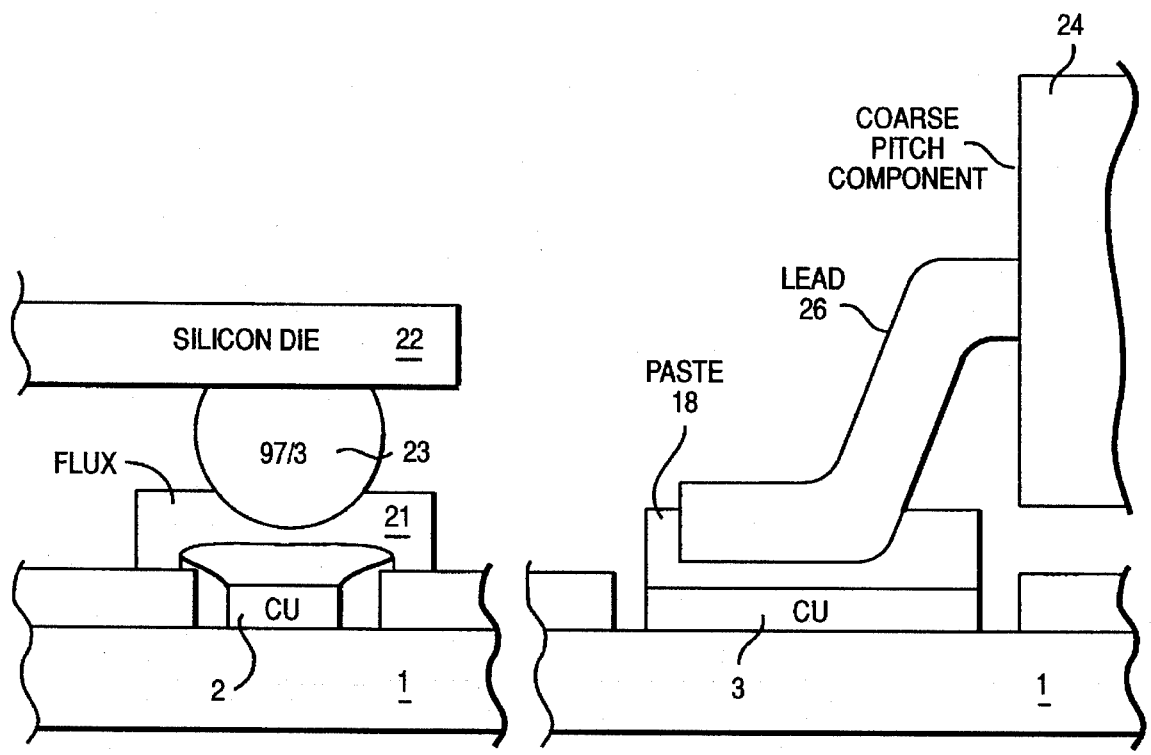
FIG. 7 depicts by schematic cross section the placement of flip-chip die in flux deposited over the fine pitch contacts and packaged component leads into the solder paste on the coarse pitch contacts.

FIG. 7 depicts by schematic cross section the placement of components following the deposition of flux 21 over the region of fine pitch contact 2. FIG. 7 also depicts the presence of silicon die 22 and a silicon die associated high melting temperature solder ball 23. Die 22 is held in alignment over fine pitch contact 2 by flux 21 during the concluding solder reflow operation. FIG. 7 also shows the placement of coarse pitch component 24 with its lead 26 inserted into paste 18, likewise for alignment to coarse pitch contact 3 during the concluding solder reflow operation.

Figure 8:
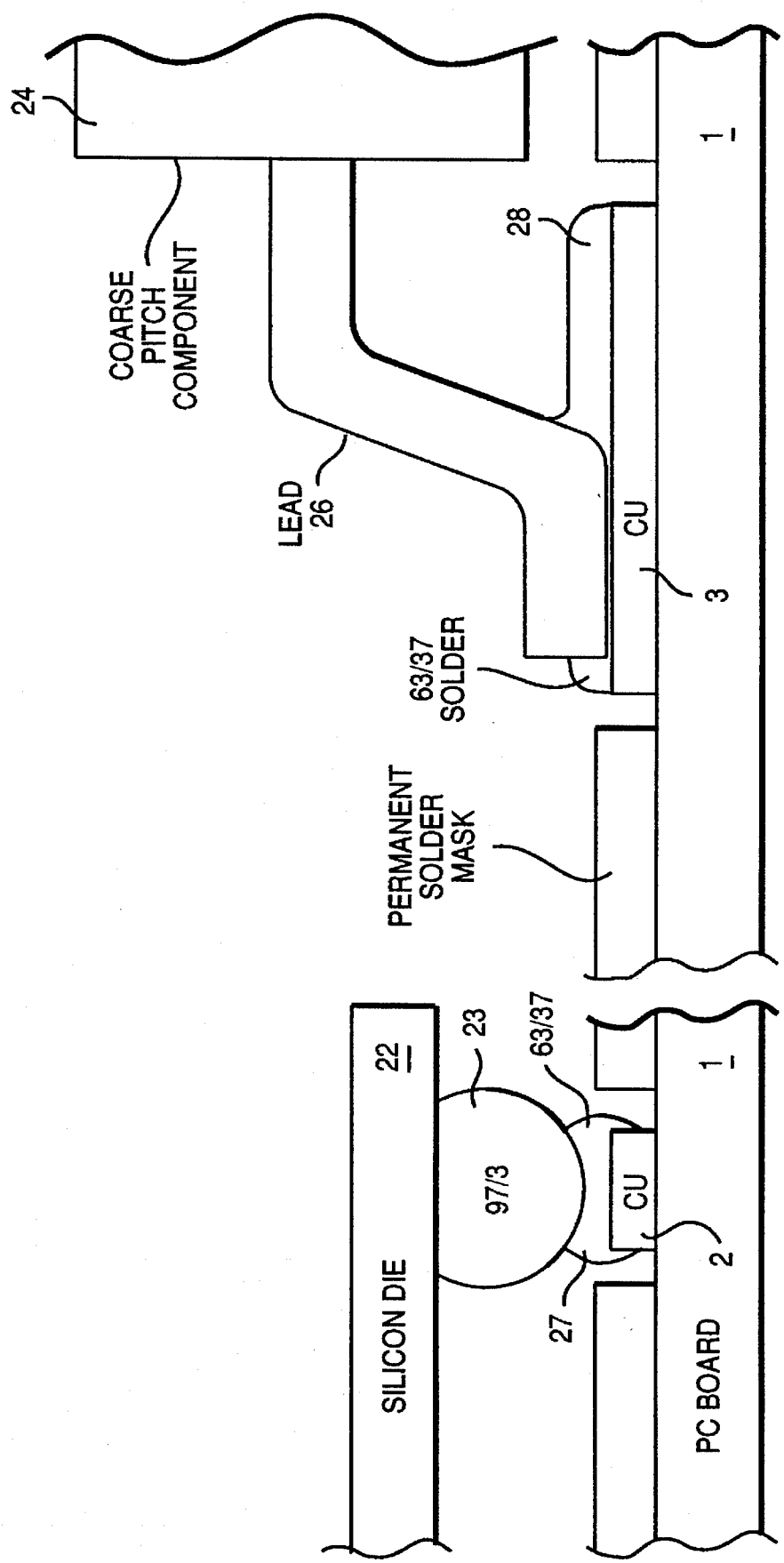
FIG. 8 depicts by schematic cross section the connection of the components following reflow.

A conventional low temperature (under 250 degrees C) reflow follows. Upon the conclusion of the reflow, high temperature solder ball 23 of silicon die 22 is electrically connected to fine pitch contact 2 of printed circuit board 1 through reflowed solder 27, the volume of solder 27 selected to be consistent with the environment contemplated for the printed circuit board. See FIG. 8. Recall that the coefficients of thermal expansion for printed circuit board 1 and silicone die 22 differ materially. Note that the same reflow operation connects coarse pitch component 24 lead 26 to coarse pitch contact 3 by solder 28 formed from paste 18.

Figure 9:
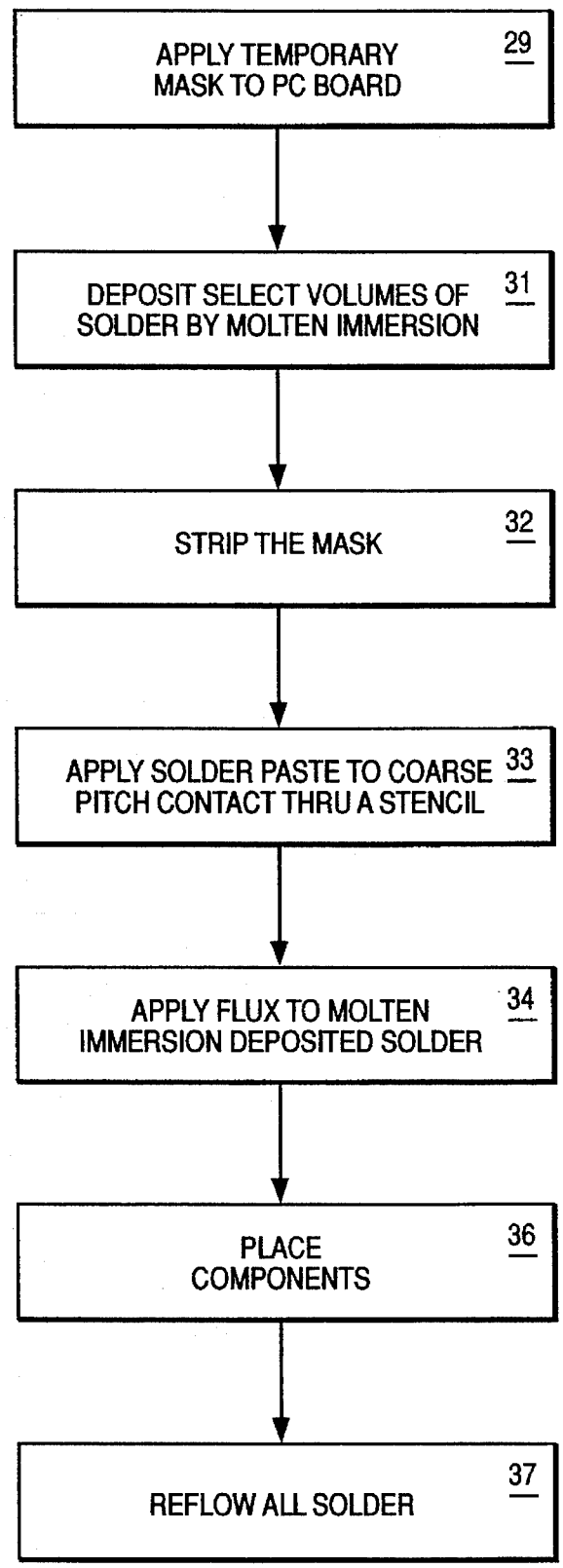
FIG. 9 provides a flow chart characterizing the process of the present invention.

FIG. 9 depicts by flow chart the operations accomplished in the succession of FIGS. 1–8, beginning with the application of a temporary mask to the printed circuit board, 29, the deposit of select volumes of solder by molten immersion, 31, the strip of the mask, 32, the application of solder paste to coarse pitch contacts through a stencil, 33, the application of flux to molten immersion deposited solder, 34, the placement of all components, 36, and the concluding reflow of all solder, 37.

The refinements introduced by the present invention will become particularly valuable as the industry progresses to finer pitch contact patterns, in that the invention provides a procedure for depositing controlled volumes of solder in fine pitch patterns without complex plating or exotic molten solder dispensing equipment. Furthermore, the process is fully compatible with convention surface mount technology equipment and methods of operation as presently used to populate circuit boards. Lastly, the process allows for the manufacture of printed circuit boards relatively independent of the manufacturing processes by which components are attached.

Although the invention has been described and illustrated by way of a specific embodiment, the methods and products encompassed by the invention should be interpreted in keeping with the breadth of the claims set forth hereinafter.

We claim:

1. A printed circuit board, comprising:
   a dielectric structure core;
   a conductive interconnect layer with fine and course pitch contacts on at least one surface of the dielectric structure core;
   solder of first volume formed on select conductive layer fine pitch contacts by:
     forming a mask over the surface having the conductive interconnected layer;
     depositing solder of first volume consistent with the mask through openings in the mask by molten solder immersion; and
     stripping the mask to expose both fine and coarse pitch contacts; and
   solder paste formed in a second volume, materially greater than the first volume, on select conductive layer coarse pitch contacts.

2. The product recited in claim 1 wherein the solder formed on the fine pitch contacts is comprised of flattened solder balls.

3. The product recited in claim 2, wherein the solder paste is stencil deposited.

4. The product recited in claim 3, wherein the fine pitch contacts are at a pitch materially less than 16 mils while the course pitch contacts are at a pitch nominally 16 mils and greater.

* * * * *